(12) United States Patent
Kikuta

(10) Patent No.: US 12,107,599 B2
(45) Date of Patent: Oct. 1, 2024

(54) DIGITAL-ANALOG CONVERTER AND DIGITAL-ANALOG CONVERTER CIRCUIT

(71) Applicant: LAPIS Technology Co., Ltd., Yokohama (JP)

(72) Inventor: Hiroyuki Kikuta, Yokohama (JP)

(73) Assignee: LAPIS TECHNOLOGY CO., LTD., Yokohama (JP)

(*) Notice: Subject to any disclaimer, the term of this patent is extended or adjusted under 35 U.S.C. 154(b) by 188 days.

(21) Appl. No.: 17/955,099

(22) Filed: Sep. 28, 2022

(65) Prior Publication Data

US 2023/0112665 A1  Apr. 13, 2023

(30) Foreign Application Priority Data

Sep. 30, 2021  (JP) ................................ 2021-162038

(51) Int. Cl.
*H03M 1/74* (2006.01)
(52) U.S. Cl.
CPC ............. *H03M 1/74* (2013.01); *H03M 1/747* (2013.01)
(58) Field of Classification Search
CPC ............................... H03M 1/74; H03M 1/747
USPC .................................................. 341/135, 144
See application file for complete search history.

(56) References Cited

U.S. PATENT DOCUMENTS

| 5,008,671 | A  |   | 4/1991 | Tuthill  |           |
|-----------|----|---|--------|----------|-----------|
| 7,564,385 | B2 | * | 7/2009 | Soude    | H03M 1/0678 |
|           |    |   |        |          | 370/479   |
| 8,089,384 | B1 | * | 1/2012 | Williams | H03M 1/005 |
|           |    |   |        |          | 341/144   |

FOREIGN PATENT DOCUMENTS

JP            H02-104026 A      4/1990

* cited by examiner

*Primary Examiner* — Khai M Nguyen
(74) *Attorney, Agent, or Firm* — Rabin & Berdo, P.C.

(57) ABSTRACT

A digital-analog converter includes a digital-analog converter circuit connected to a first mirror current circuit that receives an additional current obtained by adding a current from a voltage-current converter circuit for generating a current according to a received voltage signal to a shift current from a shift current source and a second mirror current circuit that receives the shift current. The digital-analog converter circuit includes current switching circuits. Each current switching circuit includes a first mirror current source that provides a mirror current from one of the first and the second mirror current circuit, a second mirror current source that provides a mirror current from the other, and a switch circuit that determines whether the first and the second mirror current source of each current switching circuit contribute to a value of an analog signal at an D/A output in response to a decoded signal value.

7 Claims, 11 Drawing Sheets

DIGITAL-ANALOG CONVERTER AND DIGITAL-ANALOG CONVERTER CIRCUIT

CROSS-REFERENCE TO RELATED APPLICATION

This application claims priority under 35 USC 119 from Japanese Patent Application No. 2021-162038, filed on Sep. 30, 2021, the disclosure of which is incorporated by reference herein.

BACKGROUND

Technical Field

The present disclosure relates to a digital-analog (digital to analog) converter and a digital-analog converter circuit.

Related Art

Japanese Patent Application Laid-Open (JP-A) No. 2-104026 discloses a digital-analog converter. The digital-analog converter includes a current source that provides a fixed current value, an R-2R resistor ladder, and a plurality of switches for changing resistance of the resistor ladder.

The digital-analog converter circuit disclosed in JP-A No. H02-104026, uses the resistor ladder to generate a voltage corresponding to a digital value.

The digital-analog converter circuit disclosed in JP-A No. H02-104026, changes resistance of the resistor ladder in response to a signal from a decoder, and causes a current from the constant current source to flow into the resistor ladder having the resistance changed. The constant current source includes an operational amplifier that receives a fixed reference voltage and a bipolar transistor. The use of a resistor ladder limits current drive capability at an output of a digital-analog converter circuit.

On the other hand, a current-type converter circuit adds a unit current in response to a signal from a decoder, and generates an analog voltage using a resistor that causes the added unit current to flow. A current addition type system is required to be improved in degree of freedom of current drive capability at an output of a digital-analog converter circuit.

SUMMARY

The present disclosure provides a digital-analog converter and a digital-analog converter circuit that may improve a degree of freedom of current supply capability at an output.

A first aspect of the present disclosure is a digital-analog converter including: a decoder configured to receive a digital signal having a digital value and provide plural decoded signals; a voltage-current converter circuit configured to receive a voltage signal and generate a current according to the voltage signal; a shift current source configured to generate a shift current; a first mirror current circuit configured to receive an additional current obtained by adding the current from the voltage-current converter circuit to the shift current; a second mirror current circuit configured to receive the shift current from the shift current source; and a digital-analog converter circuit connected to the first mirror current circuit and the second mirror current circuit, the digital-analog converter circuit including a D/A output that provides an analog signal corresponding to the digital value, the digital-analog converter circuit including plural current switching circuits, each of the plural current switching circuits including an output connected to the D/A output, a first mirror current source configured to supply a current to the output of each current switching circuit, and a second mirror current source configured to emit a current from the output of each current switching circuit, each of the plural current switching circuits including a switch circuit configured to determine whether the first mirror current source and the second mirror current source of each current switching circuit contribute to a value of an analog signal at the D/A output in response to one of the plural decoded signals, the plural current switching circuits including a first group of current switching circuits and a second group of current switching circuits, in each current switching circuit in the first group, the first mirror current source being configured to generate a mirror current from the first mirror current circuit and the second mirror current source being configured to generate a mirror current from the second mirror current circuit, and in each of the current switching circuit in the second group, the first mirror current source being configured to generate a mirror current from the second mirror current circuit and the second mirror current source being configured to generate a mirror current from the first mirror current circuit.

According to the digital-analog converter of the first aspect, in each of the current switching circuits, the switch circuit responds to one of the decoded signals and determines whether the first mirror current source and the second mirror current source of each current switching circuit contribute to a value of an analog signal at the D/A output. In each of the current switching circuits, the first mirror current source provides a mirror current from one of the first mirror current circuit and the second mirror current circuit, and the second mirror current source provides a mirror current from the other of the first mirror current circuit and the second mirror current circuit. For example, the first mirror current circuit receives an additional current, and the second mirror current circuit receives a shift current. Each of the current switching circuits contributes to either emission or drawing of a unit current in response to the decoded signals to the current switching circuits. The D/A output receives the contribution from a plurality of circuits among the current switching circuits.

The unit current is associated with a current corresponding to a voltage signal regardless of whether the voltage signal provided to the voltage-current converter circuit is variable or fixed.

In addition, the digital-analog converter does not necessarily require a capacitor and a resistor in the current switching circuits.

In the first group of current switching circuits, the first mirror current source of each current switching circuit provides an additional current. The second mirror current source provides a shift current. Due to a current difference between the first mirror current source and the second mirror current circuit, each current switching circuit adds the unit current and the shift current, thereby contributing to an analog voltage at the D/A output.

In the second group of current switching circuits, the first mirror current source of each current switching circuit provides a shift current. The second mirror current circuit provides an additional current. Due to a current difference between the first mirror current source and the second mirror current circuit, each current switching circuit subtracts the unit current from the shift current, thereby contributing to an analog voltage at the D/A output.

In a second aspect of the present disclosure, in the above first aspect, each of the plural current switching circuits may have the first mirror current source electrically connected between the output of each current switching circuit and a high potential power supply line, and the second mirror current source electrically connected between the output of each current switching circuit and a low potential power supply line.

In a third aspect of the present disclosure, in the above second aspect, the switch circuit may include a first switching element and a second switching element, the first switching element may be connected in series to the first mirror current source between the output of each current switching circuit and the high potential power supply line, and the second switching element may be connected in series to the second mirror current source between the output of each current switching circuit and the low potential power supply line.

According to the digital-analog converter of the third aspect, the first switching element connected in series to the first mirror current source may be placed closer to the output or the high potential power supply line than the first mirror current source. In addition, the second switching element connected in series to the second mirror current source may be placed closer to the output or the low potential power supply line than the second mirror current source.

A fourth aspect of the present disclosure, in the above first aspect, may further include, an output circuit connected to the D/A output, the output circuit including a current-voltage converter circuit, and the current-voltage converter circuit including an operational amplifier having a negative input connected to the D/A output of the digital-analog converter circuit, a positive input connected to a reference voltage line configured to provide a reference voltage from a reference voltage source, and a resistor configured to connect the negative input of the operational amplifier and an output of the operational amplifier.

Accordingly, the digital-analog converter of the forth aspect may provide the current-voltage converter circuit with a simple configuration and may enable the current-voltage converter circuit to output a current from the digital-analog converter circuit.

In a fifth aspect of the present disclosure, in the above forth aspect, the first mirror current source and the second mirror current source in each of the plural current switching circuits are connected to the reference voltage line, which is configured to provide a reference voltage from the reference voltage source, when the first mirror current source and the second mirror current source of each current switching circuit do not contribute to a value of an analog signal at the D/A output.

According to the digital-analog converter of the fifth aspect, it is possible to reduce glitch at the D/A output of the digital-analog converter circuit.

In a sixth aspect of the present disclosure, in the above fifth aspect, the switch circuit may further include a first switching element, a second switching element, a third switching element, a fourth switching element, and a reference input connected to the reference voltage line, the first switching element may be connected in series to the first mirror current source between the output of each current switching circuit and a high potential power supply line, the second switching element may be connected in series to the second mirror current source between the output of each current switching circuit and a low potential power supply line, the third switching element may be connected in series to the first mirror current source between the reference input of each current switching circuit and the high potential power supply line, the fourth switching element may be connected in series to the second mirror current source between the reference input of each current switching circuit and the low potential power supply line, the first switching element and the fourth switching element may be configured to receive a first switching signal, the second switching element and the third switching element may be configured to receive a second switching signal, and the first switching signal may serve as a complementary signal of the second switching signal.

According to the digital-analog converter of the sixth aspect, two sets of switches are opened and closed by two switching signals.

A seventh aspect of the present disclosure is a digital-analog converter circuit including: the digital-analog converter according to the first aspect as a first digital-analog converter; the digital-analog converter according to the first aspect as a second digital-analog converter; and an output circuit connected to the D/A output of the first digital-analog converter and the D/A output of the second digital-analog converter.

According to the digital-analog converter circuit of the seventh aspect, the D/A outputs of the plurality of digital-analog converters are connected at an input of the output circuit. The connection enables calculation such as addition or subtraction of a current from the first digital-analog converter, and a current from the second digital-analog converter of the plurality of digital-analog converters.

According to the above aspects, the digital-analog converter and the digital-analog converter circuit of the present disclosure may improve the degree of freedom of current supply capability at the output.

BRIEF DESCRIPTION OF THE DRAWINGS

Exemplary embodiments will be described in detail based on the following figures, wherein.

DETAILED DESCRIPTION

Hereinafter, exemplary embodiments for carrying out the present disclosure will be described with reference to the drawings.

Figure 1:
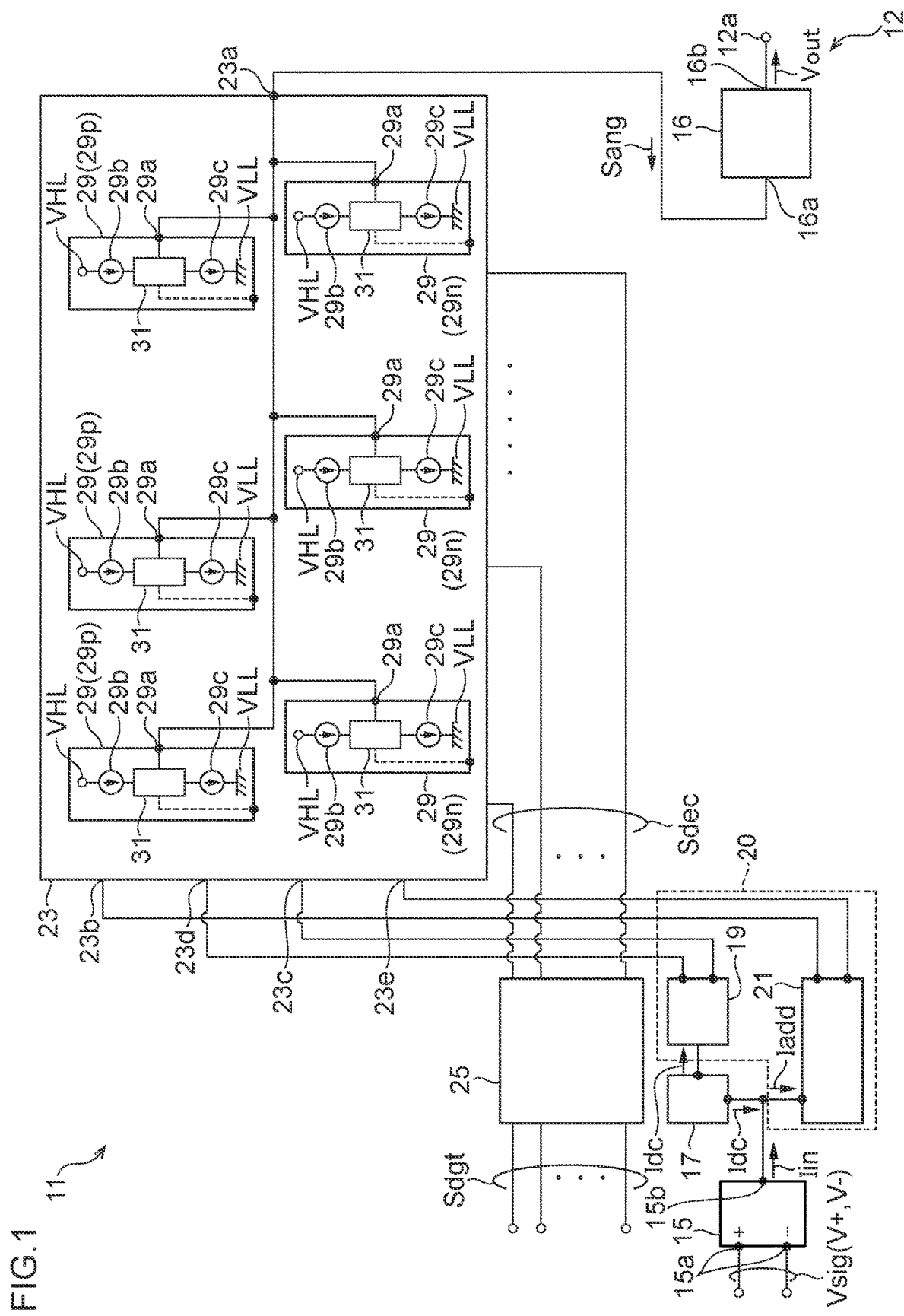
FIG. 1 is a schematic view of a digital-analog converter according to the present exemplary embodiment.

FIG. 1 is a schematic view of a digital-analog converter according to the present exemplary embodiment.

A digital-analog converter 11 receives a digital signal Sdgt having a digital value (for example, n bits) and provides an analog signal Sang corresponding to the digital signal Sdgt.

The digital-analog converter 11 includes a first circuit 15 that receives a voltage signal Vsig and generates a current according to the voltage signal Vsig, a shift current source 17 that generates a shift current Idc, a current source circuit 20, and a digital-analog converter circuit 23. The first circuit 15 includes an input 15a that receives a voltage signal Vsig (V+, V−) and an output 15b that provides a current Iin according to the voltage signal Vsig. The first circuit 15 is, for example, a voltage-current converter circuit.

The digital-analog converter 11 further includes a decoder 25. The decoder 25 receives a digital signal Sdgt having a digital value (for example, n bits), and provides a plurality of decoded signals Sdec.

The current source circuit 20 includes a first mirror current circuit 19 and a second mirror current circuit 21. The digital-analog converter circuit 23 includes a plurality of inputs 23b, 23c, 23d, and 23e. The inputs 23b, 23c, 23d, and 23e are connected to the first mirror current circuit 19 and the second mirror current circuit 21. The digital-analog converter circuit 23 also includes a D/A output 23a. The D/A output 23a generates an analog signal Sang corresponding to the digital signal Sdgt.

Specifically, the first mirror current circuit 19 receives either a shift current Idc or an additional current Iadd obtained by adding a current Iin from the first circuit 15 to the shift current Idc. In the present exemplary embodiment, the first mirror current circuit 19 receives the shift current Idc. The second mirror current circuit 21 receives either the additional current Iadd or the shift current Idc. In the present exemplary embodiment, the second mirror current circuit 21 receives the additional current Iadd.

The digital-analog converter circuit 23 includes a plurality of current switching circuits 29. The current switching circuits 29 each include an output 29a connected to the D/A output 23a, a first mirror current source 29b, and a second mirror current source 29c. The first mirror current source 29b provides a mirror current from one of the first mirror current circuit 19 or the second mirror current circuit 21. The second mirror current source 29c provides a mirror current from the other of the first mirror current circuit 19 or the second mirror current circuit 21.

Each of the current switching circuits 29 further includes a switch circuit 31. The switch circuit 31 receives one decoded signal Sdec. In response to the received decoded signal Sdec, the switch circuit 31 determines whether the first mirror current source 29b and the second mirror current source 29c of each current switching circuit 29 contribute to a value of an analog signal Sang at the D/A output 23a.

In each of the current switching circuits 29, the first mirror current source 29b is electrically connected between the output 29a of each current switching circuit 29 and a high potential power supply line VHL. The second mirror current source 29c is electrically connected between the output 29a of each current switching circuit 29 and a low potential power supply line VLL.

The digital-analog converter 11 further includes an output circuit 16 having an input 16a connected to the D/A output 23a of the digital-analog converter circuit 23. The output circuit 16 generates, for example, a voltage signal Vout according to a current at the D/A output 23a. The voltage signal Vout is provided to an output 12.

In each of the current switching circuits 29, the first mirror current source 29b provides a mirror current from one of the first mirror current circuit 19 and the second mirror current circuit 21. Furthermore, the second mirror current source 29c provides a mirror current from the other of the first mirror current circuit 19 and the second mirror current circuit 21. Specifically, in a certain current switching circuit 29, the first mirror current source 29b provides a mirror current from the first mirror current circuit 19, and the second mirror current source 29c provides a mirror current from the second mirror current circuit 21. In another current switching circuit 29, the first mirror current source 29b provides a mirror current from the second mirror current circuit 21, and the second mirror current source 29c provides a mirror current from the first mirror current circuit 19. For example, the first mirror current circuit 19 receives an additional current Iadd, and the second mirror current circuit 21 receives a shift current Idc.

The current switching circuits 29 each contribute to either supply or drawing of a unit current I0 in response to decoded signals Sdec to the current switching circuits 29. The D/A output 23a receives the contribution from the current switching circuits 29.

In addition, the digital-analog converter 11 requires neither a capacitor nor a resistor in the current switching circuits 29 as elements for converting a digital value into an analog value.

Figure 2:
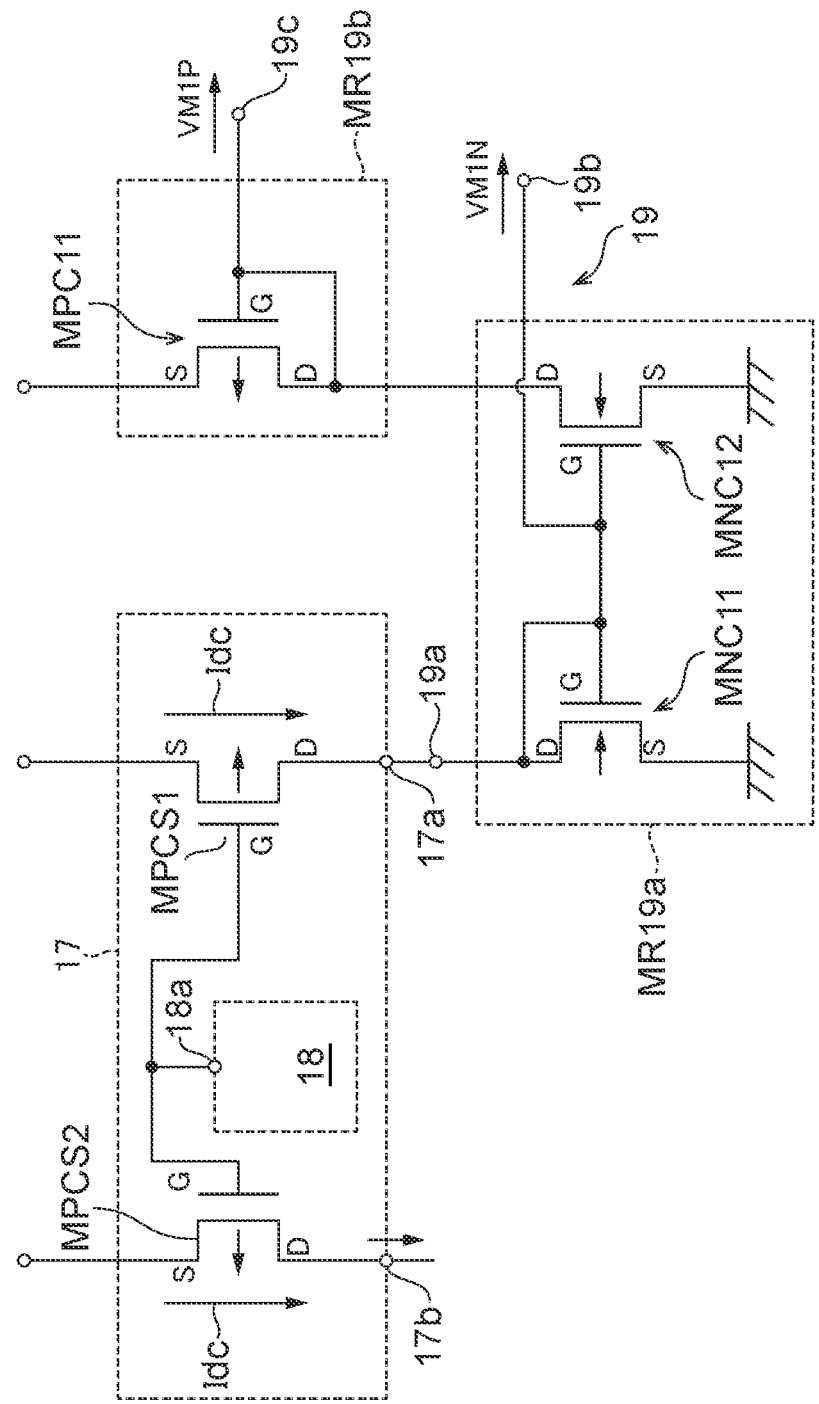
FIG. 2 is a circuit diagram of a mirror current circuit that receives a shift current among an additional current and the shift current.
Figure 3:
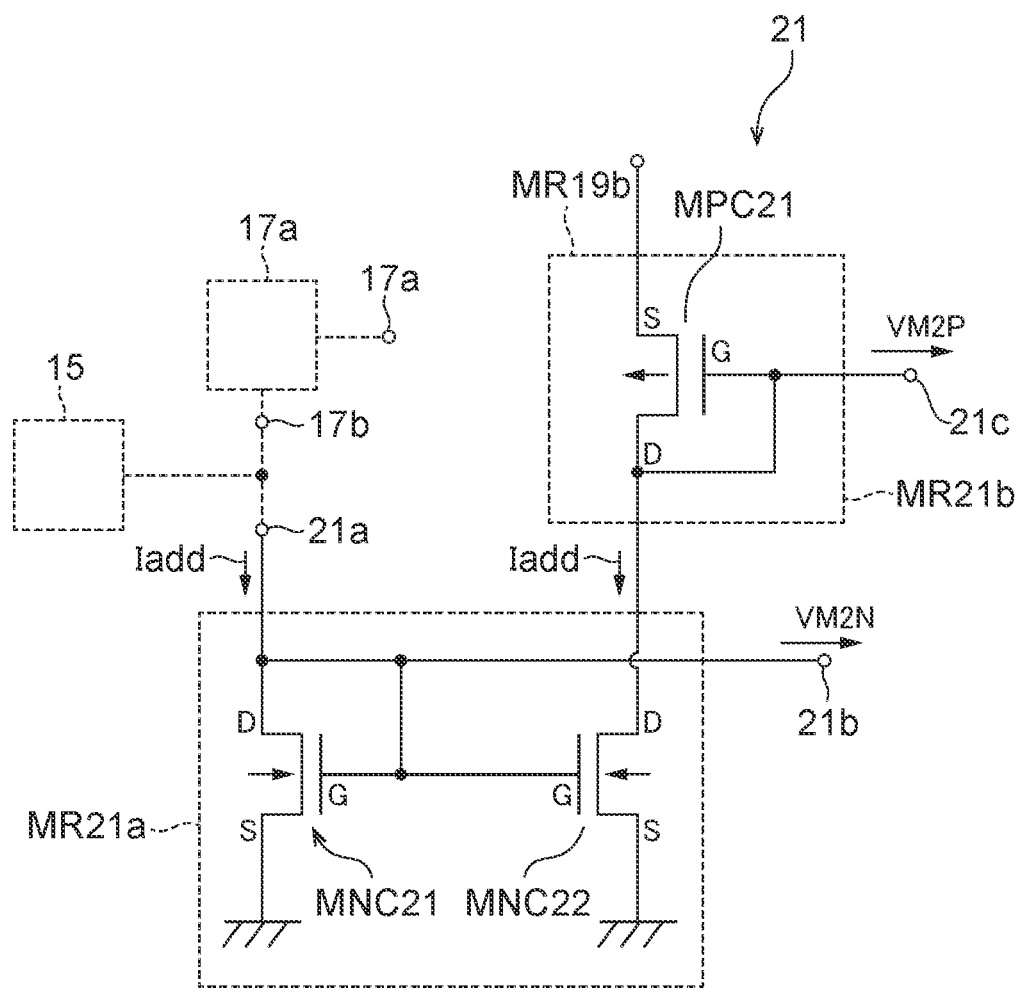
FIG. 3 is a circuit diagram of a mirror current circuit that receives an additional current among the additional current and the shift current.

FIG. 2 illustrates a circuit diagram of a mirror current circuit that receives a shift current Idc of an additional current Iadd and the shift current Idc, that is, a circuit diagram of the first mirror current circuit 19. FIG. 3 illustrates a circuit diagram of a mirror current circuit that receives the additional current Iadd of the additional current Iadd and the shift current Idc, that is, a circuit diagram of the second mirror current circuit 21. The following circuits employ a MOS transistor, but the circuits according to the present exemplary embodiment are not limited to the use of a MOS transistor and may employ, for example, a bipolar transistor. Furthermore, the circuits according to the present exemplary embodiment may include both a MOS transistor and a bipolar transistor. A MOS transistor includes a source electrode S, a drain electrode D, and a gate electrode G. A mirror current circuit changes a mirror ratio (for example, a size ratio of a transistor) to change a mirror current at an input according to the mirror ratio, thereby generating a mirror current. For purposes of illustration and not limitation, in the following description, a mirror ratio in each of the first mirror current circuit 19 and the second mirror current circuit 21 is set to 1.

FIG. 2 illustrates the shift current source 17 according to the present exemplary embodiment. The shift current source 17 includes a voltage source circuit 18 for generating a shift current Idc, transistors MPCS1 and MPCS2 of a first conductivity type (for example, p-type) for generating a mirror current of the shift current Idc, a first current output 17a, and a second current output 17b. The first current output 17a is connected to a drain electrode D of the transistor MPCS1 and provides a shift current Idc. The second current output 17b is connected to a drain electrode D of the transistor MPCS2 and provides a shift current Idc. A gate electrode G of the transistor MPCS1 and a gate electrode G of the transistor MPCS2 are connected to an output 18a of the voltage source circuit 18 and included in a mirror current circuit together with a transistor inside the voltage source circuit 18.

The first mirror current circuit 19 includes a current input 19a that receives the shift current Idc from the first current output 17a, a first voltage output 19b, and a second voltage output 19c. The shift current Idc from the current input 19a is input to a mirror current circuit MR19a. The mirror current circuit MR19a includes a transistor MNC11 and a transistor MNC12. Specifically, in the mirror current circuit MR19a, the transistor MNC11 of a second conductivity type (for example, n-type. Note that the first conductivity type is different from the second conductivity type) receives the shift current Idc at a drain electrode D. The drain electrode D of the transistor MNC11 is connected to a gate electrode G of the transistor MNC11. The drain electrode D and the gate electrode G of the transistor MNC11 is connected to a gate electrode G of the transistor MNC12. The gate electrode G of the transistor MNC12 is connected to the first voltage output 19b.

The mirror current circuit MR19a is connected to a mirror current output circuit MR19b. In the mirror current output circuit MR19b, a drain electrode D of a transistor MPC11 is connected to a drain electrode D of the transistor MNC12. The drain electrode D of the transistor MPC11 is connected to a gate electrode G of the transistor MPC11. The gate electrode G of the transistor MPC11 is connected to the second voltage output 19c.

The mirror current circuit MR19a and the mirror current output circuit MR19b respectively provide the first voltage output 19b and the second voltage output 19c with a voltage signal capable of generating a mirror current. Specifically, the first mirror current circuit 19 enables a transistor, including a gate electrode that receives a voltage signal VM1N at the first voltage output 19b, to function as a current source that generates a shift current Idc. Furthermore, the first mirror current circuit 19 enables a transistor, including a gate electrode that receives a voltage signal VM1P at the second voltage output 19c, to function as a current source that generates a shift current Idc.

Referring to FIG. 3, the second mirror current circuit 21 includes a current input 21a that receives an additional current Iadd from the output of the first circuit 15 and the second current output 17b, a first voltage output 21b, and a second voltage output 21c. The additional current Iadd from the current input 21a is input to a mirror current circuit MR21a. The mirror current circuit MR21a includes a transistor MNC21 and a transistor MNC22. Specifically, in the mirror current circuit MR21a, the transistor MNC21 receives the additional current Iadd at a drain electrode D. The drain electrode D of the transistor MNC21 is connected to a gate electrode G of the transistor MNC21 and a gate electrode G of the transistor MNC22. The gate electrode G of the transistor MNC21 is connected to the first voltage output 21b.

The mirror current circuit MR21a is connected to a mirror current output circuit MR21b. In the mirror current output circuit MR21b, a drain electrode D of a transistor MPC21 is connected to a drain electrode D of the transistor MNC22. The drain electrode D of the transistor MPC21 is connected to a gate electrode G of the transistor MPC21. The gate electrode G of the transistor MPC21 is connected to the second voltage output 21c.

The mirror current circuit MR21a and the mirror current output circuit MR21b respectively provide the first voltage output 21b and the second voltage output 21c with a voltage signal capable of generating a mirror current. Specifically, the second mirror current circuit 21 enables a transistor, including a gate electrode that receives a voltage signal VM2N at the first voltage output 21b, to function as a current source that generates an additional current Iadd. Furthermore, the second mirror current circuit 21 enables a transistor, including a gate electrode that receives a voltage signal VM2P at the second voltage output 21c, to function as a current source that generates an additional current Iadd.

Figure 4:
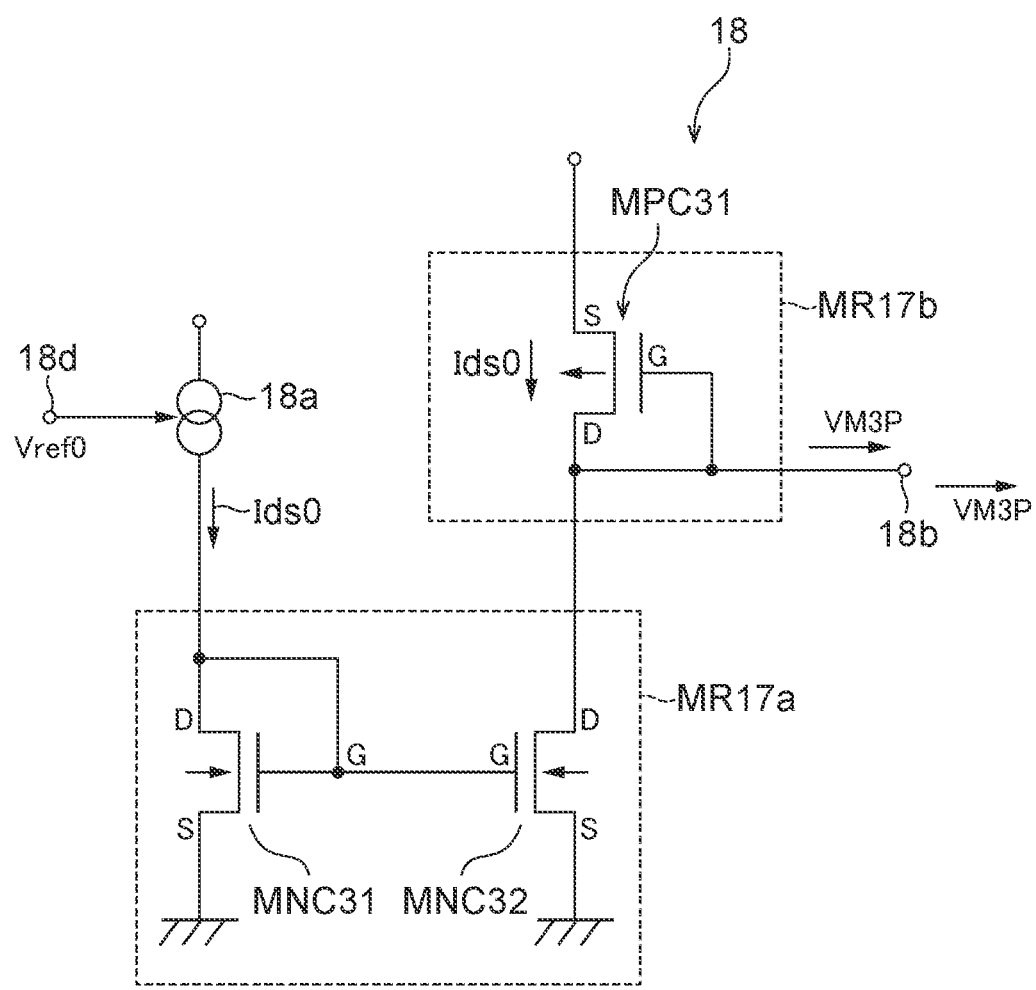
FIG. 4 is a circuit diagram illustrating an example of a voltage source circuit for generating the shift current.

FIG. 4 illustrates an example of the voltage source circuit 18 for generating a shift current Idc. The voltage source circuit 18 includes a current source circuit 18a that generates a constant current Idc0, and includes a voltage input 18d that receives a voltage reference value Vref0 that defines a current value of the current source circuit 18a when necessary.

The constant current Idc0 from the current source circuit 18a is input to a mirror current circuit MR17a. The mirror current circuit MR17a includes a transistor MNC31 and a transistor MNC32. Specifically, in the mirror current circuit MR17a, the transistor MNC31 receives the current Idc0 at a drain electrode D. The drain electrode D of the transistor MNC31 is connected to a gate electrode G of the transistor MNC31, and the drain electrode D of the transistor MNC31 is connected to a gate electrode G of the transistor MNC32. The gate electrode G of the transistor MNC32 is connected to the gate electrode G and the drain electrode D of the transistor MNC31 for applying a shift current Idc0.

The mirror current circuit MR17a is connected to a mirror current output circuit MR17b. The mirror current output circuit MR17b includes a transistor MPC31. Specifically, the transistor MPC31 receives the current Idc0 at a drain electrode D. The drain electrode D of the transistor MPC31 is connected to a gate electrode G of the transistor MPC31. The gate electrode G of the transistor MPC31 is connected to a voltage output 18b.

The voltage source circuit 18 provides the voltage output 18b with a voltage signal capable of generating a mirror current. Specifically, the voltage source circuit 18 enables a transistor, including a gate electrode that receives a voltage signal VM3P at the voltage output 18b, to function as a current source that generates a shift current Idc.

In the shift current source 17, the transistors MPCS1 and MPCS2 are connected to the voltage output 18b of the voltage source circuit 18 and receive the voltage signal VM3P.

Referring again to FIG. 1, the plurality of current switching circuits 29 may include a first group including a plurality of current switching circuits 29p and a second group including a plurality of current switching circuits 29n.

Figure 5A:
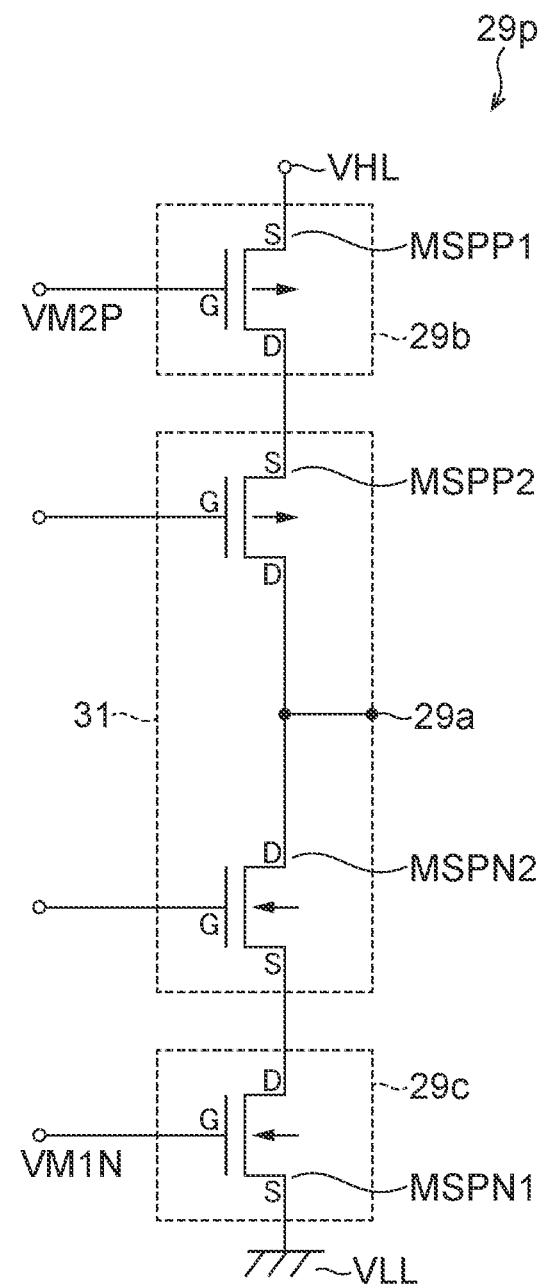
FIGS. 5A and 5B are circuit diagrams illustrating specific examples of current switching circuits.
Figure 5B:
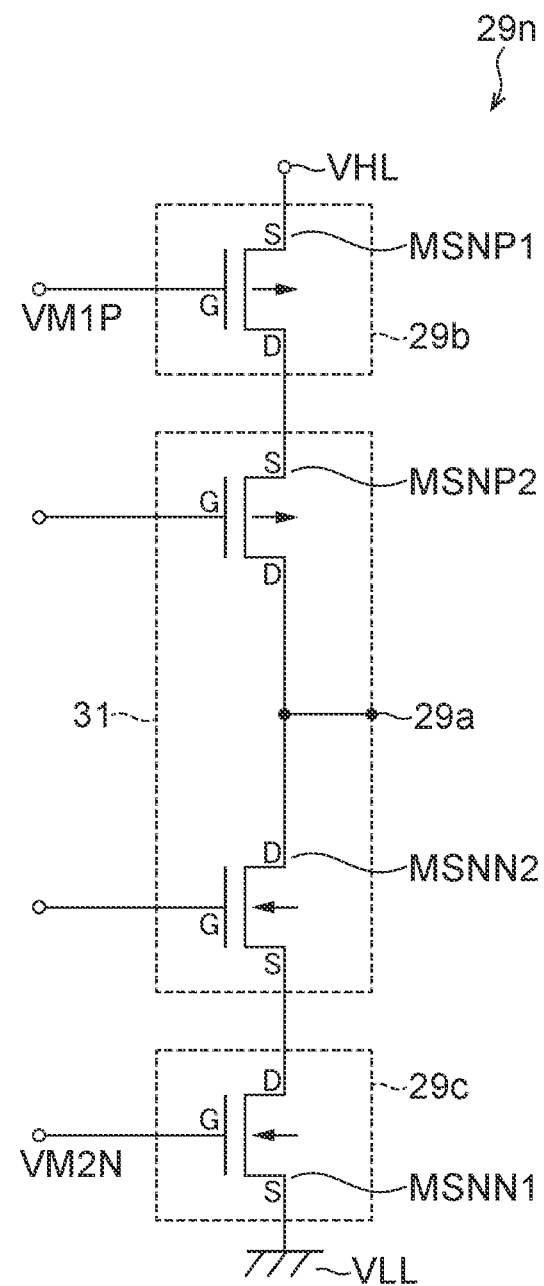

FIGS. 5A and 5B illustrate examples of a current switching circuit 29p and a current switching circuit 29n, respectively.

In the current switching circuit 29p included in the first group, the first mirror current source 29b receives the voltage signal VM2P for an additional current Iadd, and the second mirror current source 29c receives the voltage signal VM1N for a shift current Idc.

In the digital-analog converter circuit 11, the first group includes the plurality of current switching circuits 29p. Specifically, the first mirror current source 29b in the current switching circuit 29p is electrically connected between the output 29a of the current switching circuit 29p and the high potential power supply line VHL. Furthermore, the second mirror current source 29c is electrically connected between the output 29a of the current switching circuit 29p and the low potential power supply line VLL. The first mirror current source 29b generates an additional current Iadd, and the second mirror current source 29c generates a shift current Idc. Due to a current difference between the first mirror current source 29b and the second mirror current source 29c, the current switching circuit 29p adds a unit current I0 corresponding to a ½-bit digital signal to the shift current Idc, thereby contributing to an analog signal at the D/A output 23a.

In the current switching circuit 29n included in the second group, the first mirror current source 29b receives the voltage signal VM1P for a shift current Idc, and the second mirror current source 29c receives the voltage signal VM2N for an additional current Iadd.

In the digital-analog converter circuit 11, the second group includes the plurality of current switching circuits 29n. Specifically, the first mirror current source 29b in the current switching circuit 29n is electrically connected between the output 29a of the current switching circuit 29n and the high potential power supply line VHL. Furthermore, the second mirror current source 29c is electrically connected between the output 29a of the current switching circuit 29n and the low potential power supply line VLL. The first mirror current source 29b provides a shift current Idc, and the second mirror current source 29c provides an additional current Iadd. Due to a current difference between the first mirror current source 29b and the second mirror current source 29c, each current switching circuit 29n subtracts a unit current I0 corresponding to a ½-bit digital signal from the shift current Idc, thereby contributing to an analog signal at the D/A output 23a.

In each of the current switching circuit 29p and the current switching circuit 29n, the switch circuit 31 is configured to generate a first state and a second state. In the first state, a current difference between the first mirror current source 29b and the second mirror current source 29c occurs at the output 29a. In the second state, a current from both the first mirror current source 29b and the second mirror current source 29c does not occur at the output 29a.

In the example illustrated in FIGS. 5A and 5B, the switch circuit 31 is connected to the inner side of the first mirror current source 29b and the second mirror current source 29c (near the output 29a) relative to the high potential power supply line VHL and the low potential power supply line VLL. However, the switch circuit 31 may be connected to the outer side of the first mirror current source 29b and the second mirror current source 29c (near the high potential power supply line VHL and the low potential power supply line VLL).

Referring to FIGS. 5A and 5B, the current switching circuit 29p and the current switching circuit 29n will now be described.

In the current switching circuit 29p illustrated in FIG. 5A, the first mirror current source 29b includes a p-type transistor MSPP1 that receives the voltage signal VM2P (mirror current voltage) at a gate electrode G. The switch circuit 31 includes a p-type transistor MSPP2 connected in series to the p-type transistor MSPP1. For example, the p-type transistor MSPP2 may be placed on the outer side (near the high potential power supply line VHL) or inner side (near the output 29a) of the p-type transistor MSPP1.

Furthermore, the second mirror current source 29c includes an n-type transistor MSPN1 that receives the voltage signal VM1N (mirror current voltage) at a gate electrode G. The switch circuit 31 includes a n-type transistor MSPN2 connected in series to the n-type transistor MSPN1. For example, the n-type transistor MSPN2 may be placed on the outer side (near the low potential power supply line VLL) or inner side (near the output 29a) of the n-type transistor MSPN1.

In the current switching circuit 29p, while the switch circuit 31 is in the first state, signals for making the transistors MSPP2 and MSPN2 conductive are provided to gate electrodes G of the transistors MSPP2 and MSPN2 in the switch circuit 31. Furthermore, while the switch circuit 31 is in the second state, signals for making the transistors MSPP2 and MSPN2 non-conductive are provided to the gate electrodes G of the transistors MSPP2 and MSPN2.

In the current switching circuit 29n illustrated in FIG. 5B, the first mirror current source 29b includes a p-type transistor MSNP1 that receives the voltage signal VM1P (mirror current voltage) at a gate electrode G. The switch circuit 31 includes a p-type transistor MSNP2 connected in series to the p-type transistor MSNP1. For example, the p-type transistor MSNP2 may be placed on the outer side (near the high potential power supply line VHL) or inner side (near the output 29a) of the p-type transistor MSNP1.

Furthermore, the second mirror current source 29c includes an n-type transistor MSNN1 that receives the voltage signal VM2N (mirror current voltage) at a gate electrode G. The switch circuit 31 includes a n-type transistor MSNN2 connected in series to the n-type transistor MSNN1. For example, the n-type transistor MSNN2 may be placed on the outer side (near the low potential power supply line VLL) or inner side (near the output 29a) of the n-type transistor MSNN1.

In the current switching circuit 29n, while the switch circuit 31 is in the first state, signals for making the transistors MSNP2 and MSNN2 conductive are provided to gate electrodes G of the transistors MSNP2 and MSNN2 in the switch circuit 31. While the switch circuit 31 is in the second state, signals for making the transistors MSNP2 and MSNN2 non-conductive are provided to the gate electrodes G of the transistors MSNP2 and MSNN2 in the switch circuit 31.

For digital signals Sdgt with n bits, $2^{n+1}$ current switching circuits 29 are provided to the digital-analog converter circuit 23. Specifically, the number of current switching circuits 29p is $2^n$, and the number of current switching circuits 29n is $2^n$. The decoder 25 generates $2^n$ decoded signals (values of the decoded signals and inverted values of the decoded signals) Sdec.

The conversion of the digital-analog converter circuit 23 will be described.

For digital signals Sdgt with 2 bits (n=2), the number of current switching circuits 29p is 4, and the number of current switching circuits 29n is 4. In activating the current switching circuits 29p, a unit current I0 flows into the output 29a. In activating the current switching circuits 29n, the unit current I0 is drawn from the output 29a.

The 2-bit digital signals Sdgt are denoted as, for example, (00), (10), (01), and (11). An analog value is described as a sum of currents using the unit current I0. Here, in the below table, (29n) denotes the number of the current switching circuits 29n being activated, and (29p) denotes the number of the current switching circuits 29p being activated.

| Digital Input | (29n) | (29p) | Analog value (sum of currents) |
| --- | --- | --- | --- |
| (00) | 4 | 1 | $-3 \times I0$ |
| (10) | 3 | 2 | $-1 \times I0$ |
| (01) | 2 | 3 | $+1 \times I0$ |
| (11) | 1 | 4 | $+3 \times I0$ |

The decoder 25 activates four current switching circuits 29n and activates one current switching circuit 29p at the digital input value (00). The decoder 25 activates three current switching circuits 29n and activates two current switching circuits 29p at the digital input value (10). The decoder 25 activates two current switching circuits 29n and activates three current switching circuits 29p at the digital input value (01). The decoder 25 activates one current switching circuit 29n and activates four current switching circuits 29p at the digital input value (11).

An output of the decoder 25 is generated, for example, in the following manner to switch between activation ("ON") and deactivation ("OF") of the four current switching circuits 29n (specifically, n1, n2, n3, and n4) and the four current switching circuits 29p (specifically, p1, p2, p3, and p4) according to an input of the digital signals Sdgt.

| Decoder | Current switching circuits 29n | | | | Current switching circuits 29p | | | | Sum of |
|---|---|---|---|---|---|---|---|---|---|
| input | n1 | n2 | n3 | n4 | p1 | p2 | p3 | p4 | currents |
| (00) | ON | ON | ON | ON | ON | OF | OF | OF | −3 × I0 |
| (01) | ON | ON | ON | OF | ON | ON | OF | OF | −1 × I0 |
| (10) | ON | ON | OF | OF | ON | ON | ON | OF | +1 × I0 |
| (11) | ON | OF | OF | OF | ON | ON | ON | ON | +3 × I0 |

For digital signals Sdgt with 3 bits (n=3), the number of current switching circuits 29p is 8, and the number of current switching circuits 29n is 8. In activating the current switching circuits 29p, a unit current I0 flows into the D/A output 23a. In activating the current switching circuits 29n, the unit current I0 is drawn from the D/A output 23a.

The 3-bit digital signals Sdgt are denoted as, for example, (000), (100), (101), . . . , and (111) according to a method similar to one described in the 2-bit digital signals Sdgt. Here, in the below table, (29n) denotes the number of the current switching circuits 29n being activated, and (29p) denotes the number of the current switching circuits 29p being activated.

| Digital Input | (29n) | (29p) | Analog value (sum of currents) |
|---|---|---|---|
| (000) | 8 | 1 | −7 × I0 |
| (100) | 7 | 2 | −5 × I0 |

-continued

| Digital Input | (29n) | (29p) | Analog value (sum of currents) |
|---|---|---|---|
| (010) | 6 | 3 | −3 × I0 |
| (110) | 5 | 4 | −1 × I0 |
| (001) | 4 | 5 | +1 × I0 |
| (101) | 3 | 6 | +3 × I0 |
| (011) | 2 | 7 | +5 × I0 |
| (111) | 1 | 8 | +7 × I0 |

Hereinafter shown is the relationship between the decoder input and the activation of the eight current switching circuits 29p (p1 to p8).

| Decoder | Current switching circuits 29p | | | | | | | | Sum of |
|---|---|---|---|---|---|---|---|---|---|
| input | n1 | n2 | n3 | n4 | p1 | p2 | p3 | p4 | currents |
| (000) | OF | OF | OF | OF | OF | OF | OF | ON | −7 × I0 |
| (100) | OF | OF | OF | OF | OF | OF | ON | ON | −5 × I0 |
| (010) | OF | OF | OF | OF | OF | ON | ON | ON | −3 × I0 |
| (110) | OF | OF | OF | OF | ON | ON | ON | ON | −1 × I0 |
| (001) | OF | OF | OF | ON | ON | ON | ON | ON | +1 × I0 |
| (101) | OF | OF | ON | ON | ON | ON | ON | ON | +3 × I0 |
| (011) | OF | ON | ON | ON | ON | ON | ON | ON | +5 × I0 |
| (111) | ON | ON | ON | ON | ON | ON | ON | ON | +7 × I0 |

Hereinafter shown is the relationship between the decoder input and the activation of the eight current switching circuits 29n (n1 to n8).

| Decoder | Current switching circuits 29n | | | | | | | | Sum of |
|---|---|---|---|---|---|---|---|---|---|
| input | n1 | n2 | n3 | n4 | p1 | p2 | p3 | p4 | currents |
| (000) | ON | ON | ON | ON | ON | ON | ON | ON | −7 × I0 |
| (100) | ON | ON | ON | ON | ON | ON | ON | OF | −5 × I0 |
| (010) | ON | ON | ON | ON | ON | ON | OF | OF | −3 × I0 |
| (110) | ON | ON | ON | ON | ON | OF | OF | OF | −1 × I0 |
| (001) | ON | ON | ON | ON | OF | OF | OF | OF | +1 × I0 |
| (101) | ON | ON | ON | OF | OF | OF | OF | OF | +3 × I0 |
| (011) | ON | ON | OF | OF | OF | OF | OF | OF | +5 × I0 |
| (111) | ON | OF | OF | OF | OF | OF | OF | OF | +7 × I0 |

From the above, it is possible to achieve the number of current switching circuits 29p and 29n to be activated from the digital input value.

As described above, when a digital signal Sdgt has n bits, the number of current switching circuits 29p is $2^n$, and the number of current switching circuits 29n is $2^n$. The decoder 25 changes the number of current switching circuits 29p and 29n to be activated according to a digital input at the moment so that a sum of the number of current switching circuits 29p and 29n to be activated is $2^n$. In any digital input, at least one current switching circuit 29n is activated and at least one current switching circuit 29n is activated. This facilitates generation of the LSB bit. In addition, the D/A output 23a does not enter a high impedance state.

Figure 6:
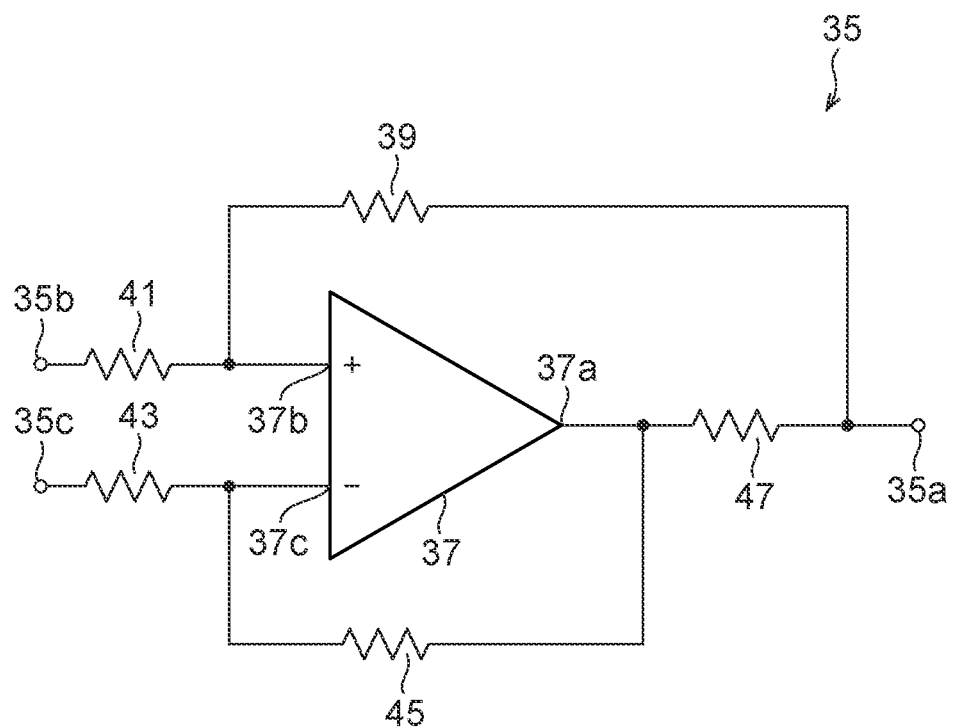
FIG. 6 is a circuit diagram illustrating an example of a voltage-current converter circuit of a digital-analog converter circuit according to the present exemplary embodiment.

FIG. 6 is a circuit diagram illustrating a voltage-current converter circuit of the digital-analog converter circuit 11 according to the present exemplary embodiment. The first circuit 15 includes, for example, a voltage-current converter circuit 35. The voltage-current converter circuit 35 includes an output 35a connected to the output 15b, and a positive input 35b and a negative input 35c connected to the input 15a.

The voltage-current converter circuit 35 receives voltage signals V+ and V− (Vsig) and generates a current Iin according to a difference between the voltage signals (V+, V−). When V+ and V− are respectively applied to the positive input 35b and the negative input 35c of the voltage-current converter circuit 35, the voltage-current converter circuit 35 generates a current Iin, and the current Iin is added to a shift current Idc in a wired circuit (connection of conductive lines) to generate an additional current Iadd. For example, when V− and V+ are respectively applied to the positive input 35b and the negative input 35c of the voltage-current converter circuit 35, the voltage-current converter circuit 35 generates a current −Iin, and the current −Iin is added to a shift current Idc in the wired circuit (connection of conductive lines). In both of the currents "+Iin" and "−Iin", an output of the wired circuit (additional circuit) is referred to as additional current Iadd. A value of the shift current Idc is larger than the absolute value of the current Iin of the voltage-current converter circuit 35 (first circuit 15).

The voltage-current converter circuit 35 includes an operational amplifier 37, a first resistor 39, a second resistor 41, a third resistor 43, a fourth resistor 45, and a fifth resistor 47. The operational amplifier 37 includes an output 37a, a positive input 37b, and a negative input 37c. The positive input 37b and the negative input 37c of the operational amplifier 37 are connected to the positive input 35b and the negative input 35c via the second resistor 41 and the third resistor 43, respectively. The fourth resistor 45 is connected between the output 37a and the positive input 37b. The output 37a is connected to the output 35a via the fifth resistor 47. The first resistor 39 is connected between the output 35a and the positive input 37b.

Figure 7:
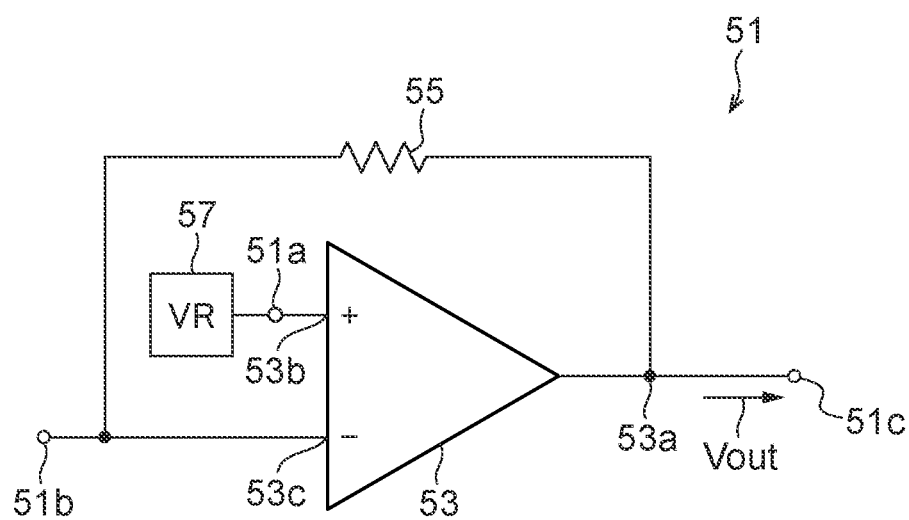
FIG. 7 is a circuit diagram illustrating an example of a current-voltage converter circuit connected to a D/A output of the digital-analog converter circuit according to the present exemplary embodiment.

FIG. 7 is a circuit diagram illustrating a current-voltage converter circuit connected to the D/A output of the digital-analog converter circuit according to the present exemplary embodiment.

The output circuit 16 includes a current-voltage converter circuit 51. The current-voltage converter circuit 51 generates a voltage according to a current received at an input. The current-voltage converter circuit 51 includes a first input 51a, a second input 51b, and an output 51c, an operational amplifier 53, and a resistor 55. The operational amplifier 53 includes an output 53a, a positive input 53b, and a negative input 53c. The positive input 53b of the operational amplifier 53 is connected to a reference voltage source 57 via the first input 51a and receives a reference potential VR. The resistor 55 is connected between the output 53a and the negative input 53c of the operational amplifier 53. The negative input 53c of the operational amplifier 53 is connected to the D/A output 23a via the second input 51b. The D/A output 23a is connected to the output 53a of the operational amplifier 53 via the resistor 55. The output 53a of the operational amplifier 53 is connected to the output 51a. In the present exemplary embodiment, a potential of the negative input 53c (D/A output 23a) in a stable state becomes the reference potential VR by a fed back action of the operational amplifier 53.

According to the digital-analog converter 11, it is possible to provide the current-voltage converter circuit 51 with a simple configuration and it is possible to enable the current-voltage converter circuit 51 to output a current related to the digital-analog converter circuit 23. The operational amplifier 53 generates a voltage signal Vout at the output 51c.

Figure 8A:
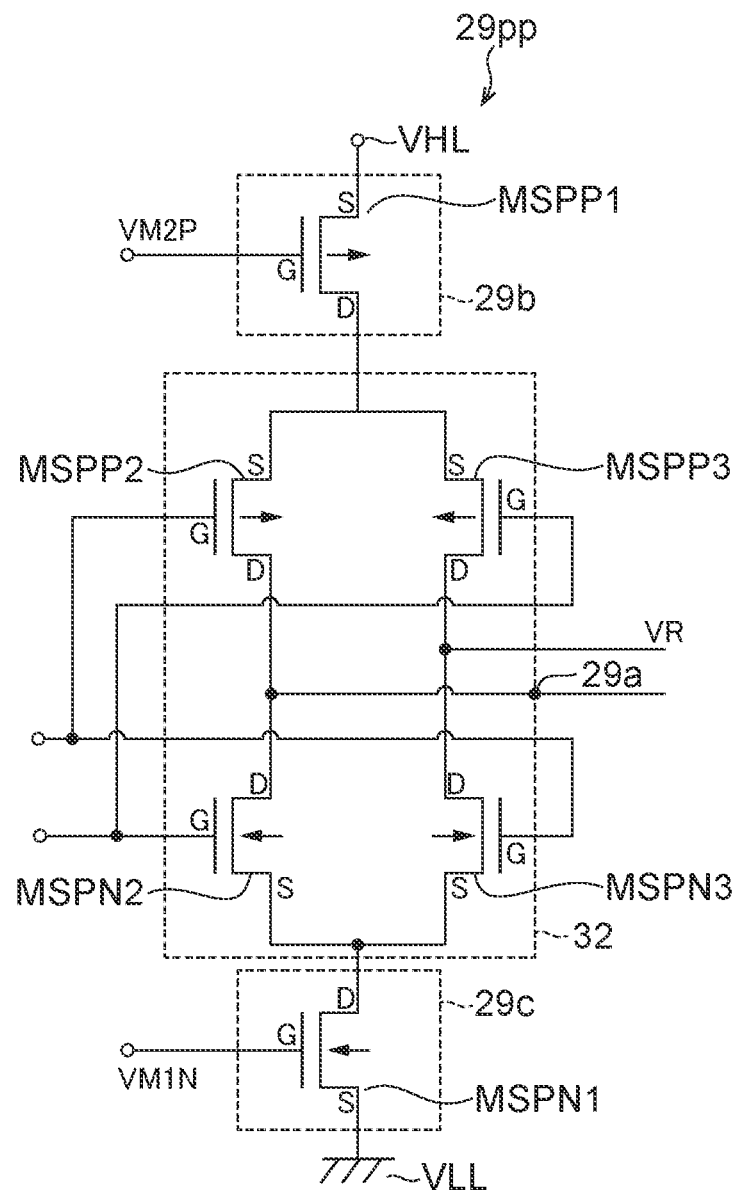
FIGS. 8A and 8B are circuit diagrams illustrating examples of other current switching circuits according to the present exemplary embodiment.
Figure 8B:
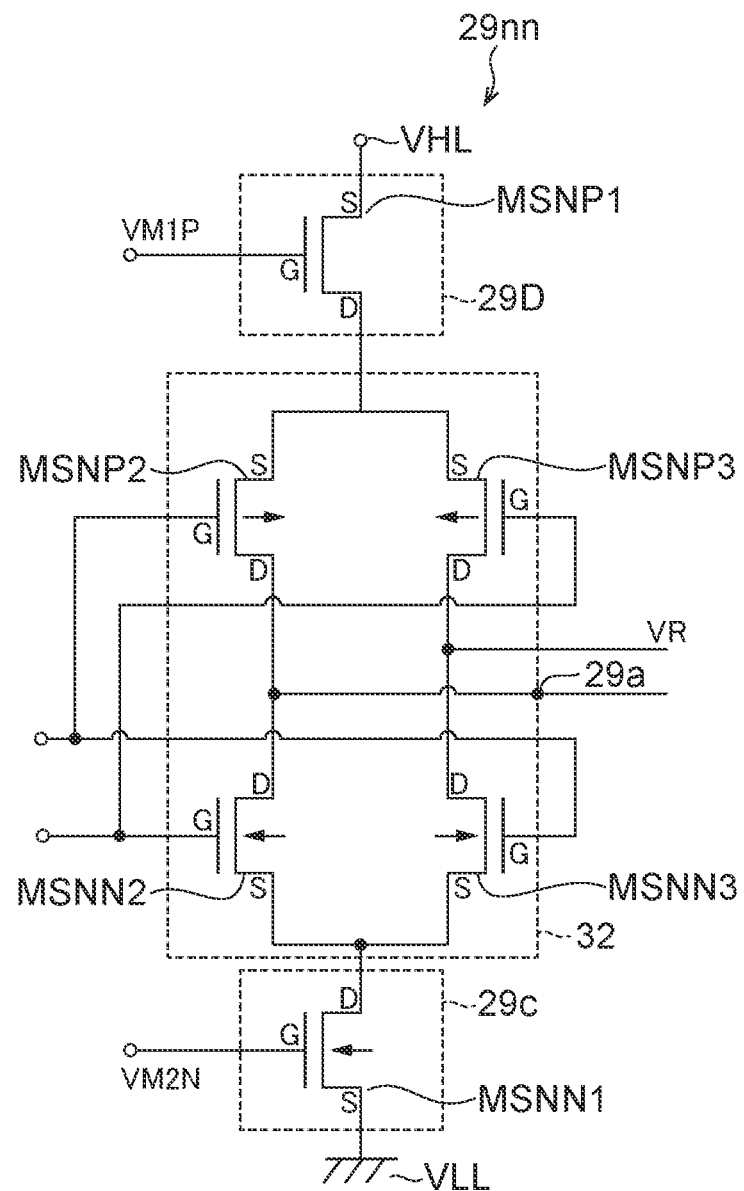

FIGS. 8A and 8B illustrate examples of other current switching circuits according to the present exemplary embodiment. Specifically, FIGS. 8A and 8B illustrate a current switching circuit 29pp and a current switching circuit 29nn, respectively. In the current switching circuit 29pp included in a first group, similarly to the current switching circuit 29p, a first mirror current source 29b receives an additional current Iadd, and a second mirror current source 29c receives a shift current Idc. In the current switching circuit 29nn included in a second group, similarly to the current switching circuit 29n, a first mirror current source 29b receives a shift current Idc, and a second mirror current source 29c receives an additional current Iadd.

Each of the current switching circuit 29pp and the current switching circuit 29nn includes a switch circuit 32 instead of the switch circuit 31 having a single output. The switch circuit 32 includes the switch circuit 31 and another switch circuit (additional transistor) that provides an additional output. The other switch circuit becomes non-conductive when the switch circuit 31 is conductive and becomes conductive when the switch circuit 31 is non-conductive.

Referring to FIG. 8A, in the current switching circuit 29pp, the switch circuit 32 includes a p-type transistor MSPP3 and an n-type transistor MSPN3 for the other switch circuit in addition to a switching element of the switch circuit 31 in the current switching circuit 29p.

Referring to FIG. 8B, in the current switching circuit 29nn, the switch circuit 32 includes a p-type transistor MSNP3 and an n-type transistor MSNN3 for the other switch circuit in addition to a switching element of the switch circuit 31 in the current switching circuit 29n.

In each of the current switching circuit 29pp and the current switching circuit 29nn, the switch circuit 32 is configured to generate a first state and a second state. In the first state, both a first mirror current source 29b and a second mirror current source 29c are connected to an output 29a and disconnected from a reference potential VR (reference voltage source 57). In the second state, both the first mirror current source 29b and the second mirror current source 29c are disconnected from the output 29a and connected to the reference potential VR (reference voltage source 57).

Similarly to the switch circuit 31, the switch circuit 32 receives two decoded signals. In the current switching circuit 29pp, the p-type transistor MSPP3 and the n-type transistor MSPN2 receive one of the two decoded signals at respective gate electrodes G. In addition, the p-type transistor MSPP2 and the n-type transistor MSPN3 receive the other of the two decoded signals at respective gate electrodes G. In the current switching circuits 29nn, the p-type transistor MSNP3 and the n-type transistor MSNN2 receive one of the two decoded signals at respective gate electrodes G. In addition, the p-type transistor MSNP2 and the n-type transistor MSNN3 receive the other of the two decoded signals at respective gate electrodes G. One decoded signal is a complementary signal of the other decoded signal.

In each of the current switching circuits 29$pp$ and 29$nn$, when the mirror current sources 29$b$ and 29$c$ of the current switching circuits do not contribute to a value of an analog signal at the D/A output 23$a$, the first mirror current source 29$b$ and the second mirror current source 29$c$ are connected to the reference voltage source 57. Accordingly, the digital-analog converter 11 may reduce glitch at the D/A output 23$a$ of the digital-analog converter circuit 23.

Figure 9:
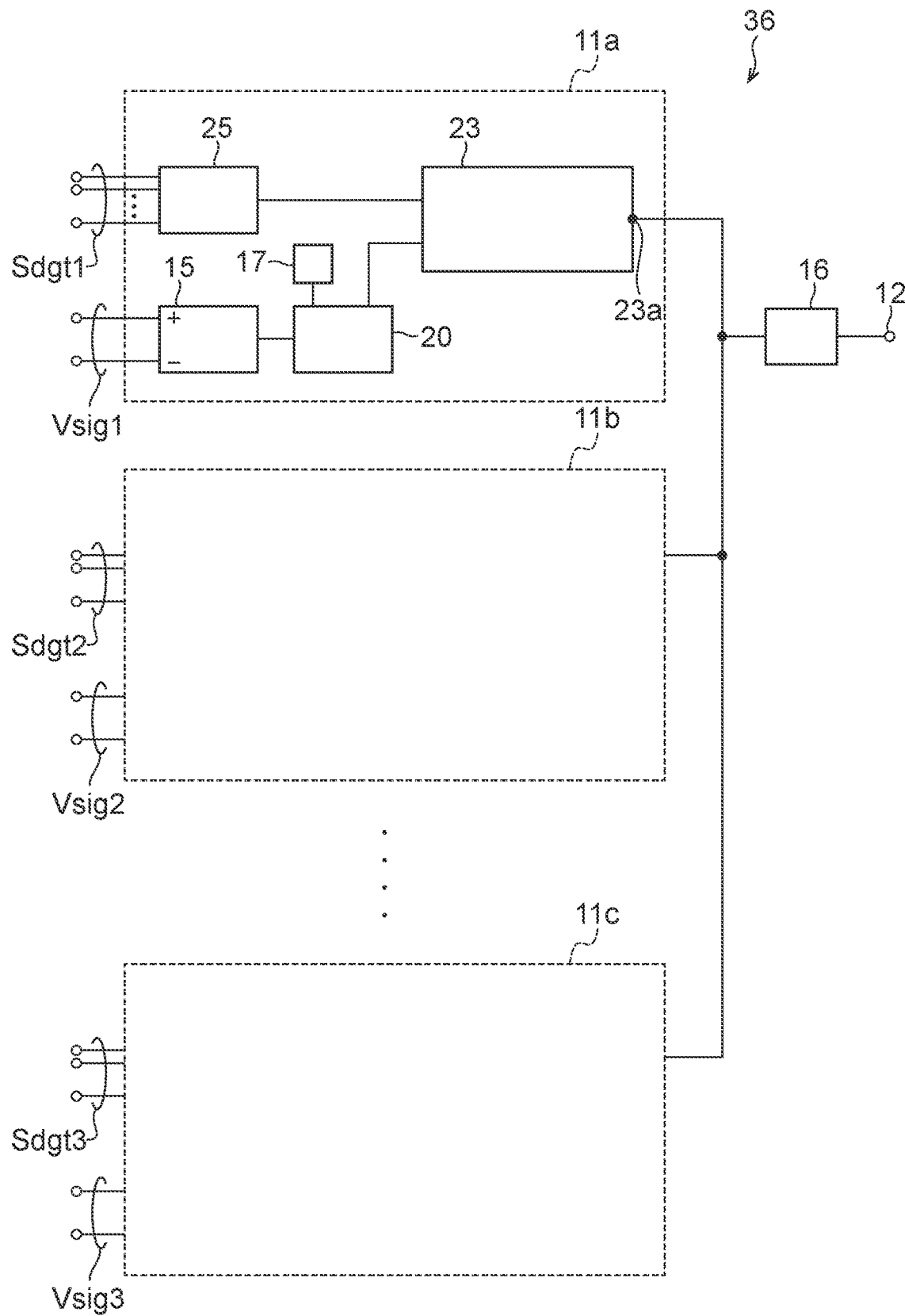
FIG. 9 is a circuit diagram of the digital-analog converter circuit according to the present exemplary embodiment.

FIG. 9 is a circuit diagram of a digital-analog converter circuit according to the present exemplary embodiment of the present disclosure.

A digital-analog converter circuit 36 includes a digital-analog converter according to the present exemplary embodiment (for example, a digital-analog converter 11$a$, a digital-analog converter 11$b$, and a digital-analog converter 11$c$). The digital-analog converter circuit 36 includes the output circuit 16 connected to a D/A output 23$a$ of a digital-analog converter circuit 23 in each of the digital-analog converters 11$a$, 11$b$, and 11$c$. The digital-analog converters 11$a$, 11$b$, and 11$c$ receive digital signals Sdgt1, Sdgt2, and Sdgt3, respectively.

This connection enables calculation such as addition and/or subtraction of a current from the first digital-analog converter 11$a$, a current from the second digital-analog converter 11$b$, and a current from the third digital-analog converter 11$c$.

As seen from the description of the digital-analog converter 11, each of the digital-analog converters 11$a$, 11$b$, and 11$c$ is provided with a voltage-current converter circuit 35. This voltage-current converter circuit 35 receives voltage signals V+ and V− (Vsig) and generates a current Iin according to a difference between the voltage signals (V+, V−). When V− and V+ are respectively applied to a positive input 35$b$ and a negative input 35$c$ of the voltage-current converter circuit 35, the voltage-current converter circuit 35 generates a current −Iin, and the current −Iin is added to a shift current Idc in a wired circuit (connection of conductive lines). For example, when V− and V+ are respectively applied to the positive input 35$b$ and the negative input 35$c$ of the voltage-current converter circuit 35, the voltage-current converter circuit 35 generates a current −Iin.

Specifically, the digital-analog converters 11$a$, 11$b$, and 11$c$ receive voltage signals Vsig11$a$, Vsig11$b$, and Vsig11$c$, respectively. Accordingly, the digital-analog converters 11$a$, 11$b$, and 11$c$ generate currents Iin11$a$, Iin11$b$, and Iin11$c$, respectively. When the voltage signals Vsig1, Vsig2, and Vsig3 are different from each other, the generated currents Iin1, Iin2, and Iin3 are also different from each other. The digital-analog converters 11$a$, 11$b$, and 11$c$ each generate an additional current corresponding to the currents Iin1, Iin2, and Iin3 at respective D/A outputs. These currents are calculated in the wired circuit (connection of the conductive wires) at an input of the output circuit 16.

The output circuit 16 includes, for example, the current-voltage converter circuit 51. The current-voltage converter circuit 51 converts the calculated sum of currents into a voltage signal.

The present disclosure is not limited to the exemplary embodiments, and various modifications may be made without departing from the gist of the present disclosure. Note that the modifications are all included in the technical idea of the present disclosure.

What is claimed is:

1. A digital-analog converter comprising:
   a decoder configured to receive a digital signal having a digital value and provide a plurality of decoded signals;
   a voltage-current converter circuit configured to receive a voltage signal and generate a current according to the voltage signal;
   a shift current source configured to generate a shift current;
   a first mirror current circuit configured to receive an additional current obtained by adding the current from the voltage-current converter circuit to the shift current;
   a second mirror current circuit configured to receive the shift current from the shift current source; and
   a digital-analog converter circuit connected to the first mirror current circuit and the second mirror current circuit, the digital-analog converter circuit including a D/A output that provides an analog signal corresponding to the digital value,
   the digital-analog converter circuit including a plurality of current switching circuits,
   each of the plurality of current switching circuits including an output connected to the D/A output, a first mirror current source configured to supply a current to the output of each current switching circuit, and a second mirror current source configured to emit a current from the output of each current switching circuit,
   each of the plurality of current switching circuits including a switch circuit configured to determine whether the first mirror current source and the second mirror current source of each current switching circuit contribute to a value of an analog signal at the D/A output in response to one of the plurality of decoded signals,
   the plurality of current switching circuits including a first group of current switching circuits and a second group of current switching circuits,
   in each current switching circuit in the first group, the first mirror current source being configured to generate a mirror current from the first mirror current circuit and the second mirror current source being configured to generate a mirror current from the second mirror current circuit, and
   in each of the current switching circuit in the second group, the first mirror current source being configured to generate a mirror current from the second mirror current circuit and the second mirror current source being configured to generate a mirror current from the first mirror current circuit.

2. The digital-analog converter according to claim 1, wherein each of the plurality of current switching circuits has the first mirror current source electrically connected between the output of each current switching circuit and a high potential power supply line, and the second mirror current source electrically connected between the output of each current switching circuit and a low potential power supply line.

3. The digital-analog converter according to claim 2, wherein:
   the switch circuit includes a first switching element and a second switching element,
   the first switching element is connected in series to the first mirror current source between the output of each current switching circuit and the high potential power supply line, and the second switching element is connected in series to the second mirror current source between the output of each current switching circuit and the low potential power supply line.

4. The digital-analog converter according to claim 1, further comprising:
an output circuit connected to the D/A output,
the output circuit including a current-voltage converter circuit, and
the current-voltage converter circuit including an operational amplifier having a negative input connected to the D/A output of the digital-analog converter circuit, a positive input connected to a reference voltage line configured to provide a reference voltage from a reference voltage source, and a resistor configured to connect the negative input of the operational amplifier and an output of the operational amplifier.

5. The digital-analog converter according to claim 4, wherein the first mirror current source and the second mirror current source in each of the plurality of current switching circuits are connected to the reference voltage line, which is configured to provide a reference voltage from the reference voltage source, when the first mirror current source and the second mirror current source of each current switching circuit do not contribute to a value of an analog signal at the D/A output.

6. The digital-analog converter according to claim 5, wherein:
the switch circuit further includes a first switching element, a second switching element, a third switching element, a fourth switching element, and a reference input connected to the reference voltage line,
the first switching element is connected in series to the first mirror current source between the output of each current switching circuit and a high potential power supply line,
the second switching element is connected in series to the second mirror current source between the output of each current switching circuit and a low potential power supply line,
the third switching element is connected in series to the first mirror current source between the reference input of each current switching circuit and the high potential power supply line,
the fourth switching element is connected in series to the second mirror current source between the reference input of each current switching circuit and the low potential power supply line,
the first switching element and the fourth switching element are configured to receive a first switching signal,
the second switching element and the third switching element are configured to receive a second switching signal, and
the first switching signal serve as a complementary signal of the second switching signal.

7. A digital-analog converter circuit comprising:
the digital-analog converter according to claim 1 as a first digital-analog converter;
the digital-analog converter according to claim 1 as a second digital-analog converter; and
an output circuit connected to the D/A output of the first digital-analog converter and the D/A output of the second digital-analog converter.

* * * * *